(12) United States Patent
Dosho et al.

(10) Patent No.: US 8,963,753 B2
(45) Date of Patent: Feb. 24, 2015

(54) OVERSAMPLING A/D CONVERTER (71) Applicant: Panasonic Corporation, Osaka (JP)

(72) Inventors: Shiro Dosho, Osaka (JP); Kazuo Matsukawa, Osaka (JP); Masao Takayama, Osaka (JP); Yosuke Mitani, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 141 days.

(21) Appl. No.: 13/898,420

(22) Filed: May 20, 2013

(65) Prior Publication Data

US 2013/0249718 A1 Sep. 26, 2013

Related U.S. Application Data

(63) Continuation of application No. 13/025,666, filed on Feb. 11, 2011, now Pat. No. 8,466,820, and a continuation of application No. PCT/JP2009/001416, filed on Mar. 27, 2009.

(30) Foreign Application Priority Data

Aug. 19, 2008  (JP) ................ 2008-210843

(51) Int. Cl.
*H03M 3/00* (2006.01)
*H03M 1/12* (2006.01)

(52) U.S. Cl.
CPC ............... *H03M 1/12* (2013.01); *H03M 3/344* (2013.01); *H03M 3/43* (2013.01); *H03M 3/454* (2013.01)
USPC .......................................... 341/143; 341/155

(58) Field of Classification Search
CPC ....... H03M 1/12; H03M 3/344; H03M 3/454; H03M 3/43
USPC .......................................... 341/143, 144, 145
See application file for complete search history.

(56) References Cited

U.S. PATENT DOCUMENTS

| 5,652,770 A | * | 7/1997 | Eatwell ......................... 375/350 |
| 6,271,782 B1 | | 8/2001 | Steensgaard-Madsen |
| 7,119,608 B2 | | 10/2006 | Doerrer |

(Continued)

FOREIGN PATENT DOCUMENTS

| JP | 2003-198374 | 7/2003 |
| JP | 2008-135943 | 6/2008 |

OTHER PUBLICATIONS

T. Waho et al., "Understanding Delta-Sigma Data Converters," Aug. 15, 2007, p. 168-179.

(Continued)

*Primary Examiner* — Peguy Jean Pierre
(74) *Attorney, Agent, or Firm* — McDermott Will & Emery LLP (57) ABSTRACT

An oversampling A/D converter includes a first filter including a first resistive element, a first capacitive element, a second resistive element, an operational amplifier, and a second capacitive element; a second filter receiving an output of the first filter; a third filter including a third resistive element, a third capacitive element, and a fourth resistive element; a quantizer receiving an output of the third filter and generating a digital signal; and a D/A converter converting the digital signal to an analog current signal. The D/A converter inputs the generated analog current signal to an inverting input terminal of the operational amplifier.

7 Claims, 6 Drawing Sheets

(56) References Cited

U.S. PATENT DOCUMENTS

| | | |
|---|---|---|
| 7,176,819 B1 | 2/2007 | Swerlein et al. |
| 7,509,104 B2 | 3/2009 | Song |
| 8,258,990 B2 | 9/2012 | Dosho et al. |
| 2003/0076253 A1 | 4/2003 | Roovers et al. |
| 2003/0117306 A1 | 6/2003 | Okuda et al. |
| 2005/0052226 A1 | 3/2005 | Doerrer |
| 2006/0164272 A1 | 7/2006 | Philips et al. |
| 2007/0139238 A1 | 6/2007 | Van Veldhoven |

OTHER PUBLICATIONS

Paulo G.R. Silvia et al., "An 118dB DR CT IF-to-Baseband $\Sigma\Delta$ Modular for AM/FM/IBOC Radio Receivers," ISSCC 2006/Session 3/Oversampling ADCs/3.3, Feb. 6, 2006.

G. Mitteregger et al., "A 14b 20mW 640 MHz CMOS CT $\Delta\Sigma$ ADC with 20Mhz Signal Bandwidth and 12b ENOB," ISSOC 2006/Session 3/Oversampling ADCs/3.1, Feb. 6, 2006.

R. Schreier et al., "Delta-Sigma Modulators Employing Continuous-Time Circuitry," IEEE Transactions on Circuits and Systems—I: Fundamental Theory and Applications, vol. 43, No. 4, Apr. 1996.

X. Chen et al., "A 18mW $\Delta\Sigma$ Modulator with 25MHz Bandwidth for Next Generation Wireless Applications," IEEE 2007 Custom Integrated Circuits Conference (CICC), 2007.

Notice of Allowance for U.S. Appl. No. 13/025,666 with date mailed Feb. 19, 2013.

\* cited by examiner

OVERSAMPLING A/D CONVERTER

CROSS-REFERENCE TO RELATED APPLICATION

This is a continuation of application Ser. No. 13/025,666 filed on Feb. 11, 2011, which is a continuation of PCT International Application PCT/JP2009/001416 filed on Mar. 27, 2009, which claims priority to Japanese Patent Application No. 2008-210843 filed on Aug. 19, 2008. The disclosures of these applications including the specifications, the drawings, and the claims are hereby incorporated by reference in their entirety.

BACKGROUND

The present disclosure relates to oversampling A/D converters, and more particularly to continuous-time delta sigma A/D converters.

Oversampling A/D converters are widely used for front ends of communication devices and conversion of audio signals, and are essential circuit techniques for present communication, video and audio signal processing circuits. As a type of oversampling A/D converters, there are continuous-time delta sigma A/D converters (CTDS-ADCs) including continuous-time filters such as integrators (see, for example, Richard Schreier and Bo Bang, Delta-Sigma Modulators Employing Continuous-Time Circuitry, IEEE TRANSACTIONS ON CIRCUITS AND SYSTEMS—I: FUNDAMENTAL THEORY AND APPLICATIONS, VOL. 43, NO. 4, APRIL 1996, and Xuefeng Chen et al., A 18 mW CT ΔΣ Modulator with 25 MHz Bandwidth for Next Generation Wireless Applications, IEEE 2007 Custom Integrated Circuits Conference, 2007).

In a conventional CTDS-ADC, an input signal passes through a number n of cascade-coupled integrators and is quantized by a quantizer. An output of the quantizer is converted to current signals by a number n of D/A converters, and then fed back to the respective number n of integrators. Since CTDS-ADCs do not include any switch in an analog circuit, voltages can be lowered. Moreover, CTDS-ADCs do not require any prefilter which is usually needed when using a sampling filter. In these respects, CTDS-ADCs are suited for application of communication systems, and the application has been increasingly researched and developed.

The accuracy of A/D conversion of a conventional CTDS-ADC largely depends on linear characteristics, a dynamic range, etc. of continuous-time filters through which an input signal passes. Thus, some converters are modified by feeding forward an input signal to an input of a quantizer, and feeding back an output of the quantizer to an input of the continuous-time filters so that the input signal is removed at a stage preceding the continuous-time filters, and only quantized noise passes through the continuous-time filters (see, for example, Paulo G. R. Silva, Lucien J. Breems, Kofi A. A. Makinwa, Raf Roovers, Johan H. Huijsing, An 118 dB DR CT IF-to-Baseband ΣΔ Modulator for AM/FM/IBOC Radio Receivers, ISSCC 2006/SESSION 3/OVERSAMPLING ADCs/3.3, Feb. 6, 2006). With this configuration, linear characteristics and a dynamic range required for the continuous-time filters are largely reduced, thereby simplifying the circuit configuration and reducing power consumption. On the other hand, the technique for improving operational stability of a CTDS-ADC by feeding back an output of a quantizer to an input of the quantizer is also known (see, for example, G. Mitteregger, C. Ebner, S. Mechnig, T. Blon, C. Holuigue, E. Romani, A. Melodia, V. Melini, A 14b 20 mW 640 MHz CMOS CT ΔΣ ADC with 20 MHz Signal Bandwidth and 12b ENOB, ISSCC 2006/SESSION 3/OVERSAMPLING ADCs/ 3.1, Feb. 6, 2006).

SUMMARY

In a modified CTDS-ADC, active elements such as transistors are used in a portion in which a fed forward input signal and an output of continuous-time filters are summed. Even so, when an input signal passes through the portion, signal distortion is caused by nonlinearity of the active elements forming the portion, etc.

In the modified CTDS-ADC, when a filter for anti-aliasing processing of a fed forward input signal is inserted at a stage preceding a quantizer, a filter having the same circuit configuration also needs to be inserted at a stage preceding the continuous-time filters. If the filter includes active elements, the anti-aliasing filter is also formed by active elements, thereby causing signal distortion. Moreover, when an output of the quantizer is fed back to an input of the quantizer to improve operational stability of the modified CTDS-ADC, an input signal cannot be removed at a stage preceding the continuous-time filters simply by inserting filters having the same circuit configurations at a preceding stage of the quantizer and the continuous-time filters.

The present disclosure may be advantageous when in a CTDS-ADC, in which an input signal is fed forward, signal distortion is to be reduced, and anti-aliasing processing is to be enabled, and furthermore, operational stability is to be improved.

An example oversampling A/D converter, which is configured to perform digital conversion of an input signal, includes a first filter including a first resistive element configured to receive the input signal at a first end, a first capacitive element coupled to a second end of the first resistive element at a first end, and coupled to a common node at a second end, a second resistive element coupled to the first end of the first capacitive element at a first end, an operational amplifier coupled to a second end of the second resistive element at an inverting input terminal, and coupled to the common node at a non-inverting input terminal, and a second capacitive element coupled between an output terminal and the inverting input terminal of the operational amplifier, the first filter configured to output a signal from the output terminal of the operational amplifier; a second filter configured to receive an output of the first filter; a third filter including a third resistive element configured to receive the input signal at a first end, a third capacitive element coupled to a second end of the third resistive element at a first end, and coupled to the common node at a second end, and a fourth resistive element coupled to an output terminal of the second filter at a first end, and coupled to the first end of the third capacitive element at a second end, the third filter configured to output a signal from the first end of the third capacitive element; a quantizer configured to receive an output of the third filter and generate a digital signal; and a D/A converter configured to convert the digital signal to an analog current signal, and input the current signal to the inverting input terminal of the operational amplifier.

With this configuration, resistance values of the first to fourth resistive elements and the capacitance values of the first and third capacitive elements are set to predetermined ratios, thereby removing the input signal at a stage preceding the second filter. Moreover, since the fed forward input signal is input to the quantizer without passing through any active element, signal distortion can be reduced. Furthermore, the third filter functions as an anti-aliasing filter.

The fourth resistive element may be replaced with a voltage-current conversion element coupled to an output terminal of the second filter at an input terminal, and coupled to the first end of the third capacitive element at an output terminal. With this configuration, a gain of the third filter can be maintained large.

The oversampling A/D converter may further include a D/A converter configured to convert the digital signal to an analog current signal, and input the current signal to the first end of the first capacitive element. With this configuration, the resistance values of the first to fourth resistive elements, and the capacitance values of the first and third capacitive elements are set to the same values, thereby removing the input signal at a stage preceding the second filter.

Each of the above-described oversampling A/D converters preferably includes a D/A converter configured to convert the digital signal to an analog current signal, and input the current signal to the first end of the third capacitive element. This configuration improves operational stability of the oversampling A/D converter.

In the oversampling A/D converter including the fourth resistive element, the output terminal of the D/A converter may not be coupled to the inverting input terminal of the operational amplifier, but to the first end of the first capacitive element. With this configuration, the resistance values of the first to fourth resistive elements, and the capacitance values of the first and third capacitive elements are set to the same values, thereby removing the input signal at a stage preceding the second filter.

Another example oversampling A/D converter, which is configured to perform digital conversion of an input signal, includes a first filter including a first resistive element configured to receive the input signal at a first end, a first capacitive element coupled to a second end of the first resistive element at a first end, and coupled to a common node at a second end, and a voltage-current conversion element coupled to the first end of the first capacitive element at an input terminal, the first filter configured to output a signal from the output terminal of the voltage-current conversion element; a second filter configured to receive an output of the first filter; a third filter including a second resistive element configured to receive the input signal at a first end, a second capacitive element coupled to a second end of the second resistive element at a first end, and coupled to the common node at a second end, and a third resistive element coupled to an output terminal of the second filter at a first end, and coupled to the first end of the second capacitive element at a second end, the third filter configured to output a signal from the first end of the second capacitive element; a quantizer configured to receive an output of the third filter and generate a digital signal; an inverting amplifier configured to receive the digital signal; and a fourth resistive element coupled between an output terminal of the inverting amplifier and the first end of the first capacitive element.

With this configuration, the resistance values of the first to fourth resistive elements, and the capacitance values of the first and third capacitive elements are set to the same values, thereby removing the input signal at a stage preceding the second filter. Moreover, since the fed forward input signal is input to the quantizer without passing through any active element, signal distortion can be reduced. Furthermore, the third filter functions as an anti-aliasing filter.

The third resistive element may be replaced with a voltage-current conversion element coupled to an output terminal of the second filter at an input terminal, and coupled to the first end of the second capacitive element at an output terminal; and the inverting amplifier and the fourth resistive element may be replaced with a D/A converter configured to convert the digital signal to an analog current signal, and input the current signal to the first end of the first capacitive element. With this configuration, the gain of the third filter can be maintained large.

DETAILED DESCRIPTION

First Embodiment

Figure 1:
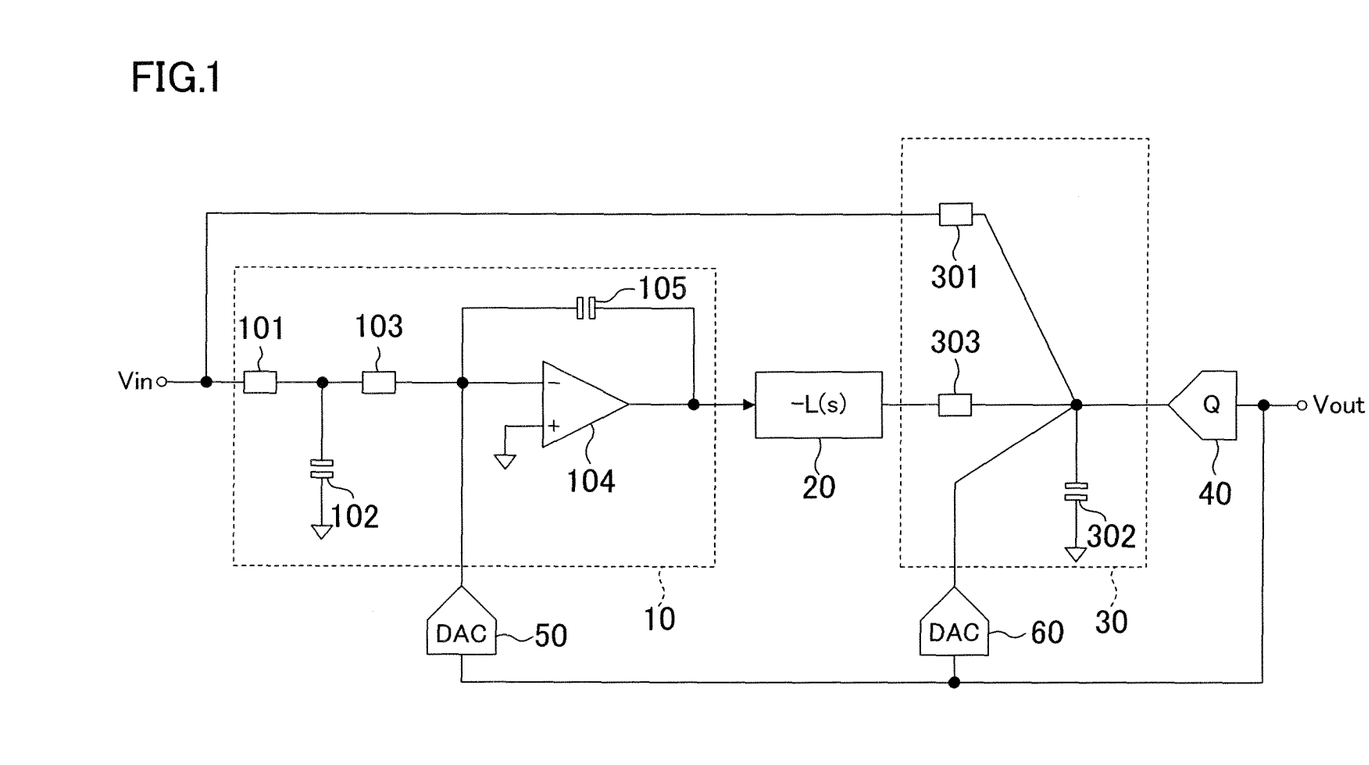
FIG. 1 is a configuration diagram of an oversampling A/D converter according to a first embodiment.

FIG. 1 illustrates a configuration of a CTDS-ADC according to a first embodiment. In the CTDS-ADC according to this embodiment, a filter 10 includes a resistive element 101 receiving an input signal Vin at a first end, a capacitive element 102 coupled to a second end of the resistive element 101 at a first end, and coupled to a common node at a second end, a resistive element 103 coupled to the first end of the capacitive element 102 at a first end, an operational amplifier 104 coupled to a second end of the resistive element 103 at an inverting input terminal, and coupled to the common node at an non-inverting input terminal, and a capacitive element 105 coupled to between the inverting input terminal and an output terminal of the operational amplifier 104. The filter 10 outputs a signal from the output terminal of the operational amplifier 104. A filter 20 is a continuous-time filter receiving an output of the filter 10. A filter 30 includes a resistive element 301 receiving the input signal Vin at a first end, a capacitive element 302 coupled to a second end of the resistive element 301 at a first end, and coupled to the common node at a second end, and a resistive element 303 coupled to an output terminal of the filter 20 at a first end, and coupled to the first end of the capacitive element 302 at a second end. The filter 30 outputs a signal from the first end of the capacitive element 302. That is, the filter 30 has the function of summing the input signal Vin and the output of the filter 20. A quantizer 40 receives an output of the filter 30, and generates a digital signal Vout. A D/A converter 50 converts the digital signal Vout to an analog current signal, and inputs the current signal to the inverting input terminal of the operational amplifier 104. A D/A converter 60 converts the digital signal Vout to an analog current signal, and inputs the current signal to the first end of the capacitive element 302.

In the CTDS-ADC according to this embodiment, where resistance values of the resistive element 301 and the resistive element 303 are R, a capacitance value of the capacitive element 302 is C, and a gain (gm value) of the D/A converter 50 is $-1/R$, and a gain of the D/A converter 60 is $-\alpha/R$; a resistance value of the resistive element 101 is set to $(n+\alpha-\beta)R$, a resistance value of the resistive element 103 is set to $\beta R$, and a capacitance value of the capacitive element 102 is set to $C/((n+\alpha)\beta-\beta^2)$. Note that n represents the number of the resistive elements coupled to the capacitive element 302

(where n=2), $\beta$ is a constant which can be arbitrarily set within a range in which the resistive element 101, the resistive element 103, and the capacitive element 102 do not have negative values. Where $\beta=(n+\alpha)/2$, the capacitive element 102 has the minimum capacitance value.

Where a capacitance value of the capacitive element 105 is $C_1$, a transfer function of the filter 20 is $-L(s)$, an output voltage at the first end of the capacitive element 102 is $V_1$, an output voltage of the filter 10 is $V_2$, an output voltage of the filter 20 is $V_3$, and an output voltage of the filter 30 is $V_4$; the following nodal equation can be obtained. Note that s is a Laplace operator, and Q represents quantized noise.

$$\begin{cases} \dfrac{V_1 - V_{in}}{(n+\alpha-\beta)R} + V_1 \cdot s\left[\dfrac{C}{((n+\alpha)\beta-\beta^2)}\right] + \dfrac{V_1}{\beta R} = 0 \\ -\dfrac{V_1}{\beta R} - V_2 \cdot s \cdot C_1 + \dfrac{V_{out}}{R} = 0 \\ V_3 = -V_2 \cdot L(s) \\ \dfrac{(V_4 - V_{in})}{R} + \dfrac{(V_4 - V_3)}{R} + \alpha \cdot \dfrac{V_{out}}{R} + V_4 \cdot s \cdot C = 0 \\ V_{out} = V_4 + Q \end{cases} \quad \text{Equation 1}$$

When n=2 is substituted into the nodal equation to calculate a component of the input signal Vin appearing in the voltage $V_2$, zero is obtained. That is, the input signal Vin is removed at a stage preceding the filter 20, and only the quantized noise is input to the filter 20. Moreover, since the fed forward input signal Vin is input to the quantizer 40 without passing through any active element, signal distortion can be reduced. On the other hand, signal distortion may occur in the D/A converter 50 and the D/A converter 60. However, since distortion errors in a D/A converter can be diffused in a high-frequency region by dynamic element matching, there may be no need to consider the signal distortion in the D/A converter 50 and the D/A converter 60.

Where a component of the input signal Vin appearing in the digital signal Vout is calculated, $Vout=Vin/(s \cdot C \cdot R+2+\alpha)$ is obtained. That is, the filter 30 functions as an anti-aliasing filter of the fed forward input signal Vin. Moreover, in the CTDS-ADC according to this embodiment, the digital signal Vout is fed back to an input of the quantizer 40, and thus, excellent operational stability is provided. Note that the D/A converter 60 can be omitted (i.e., $\alpha=0$).

Second Embodiment

Figure 2:
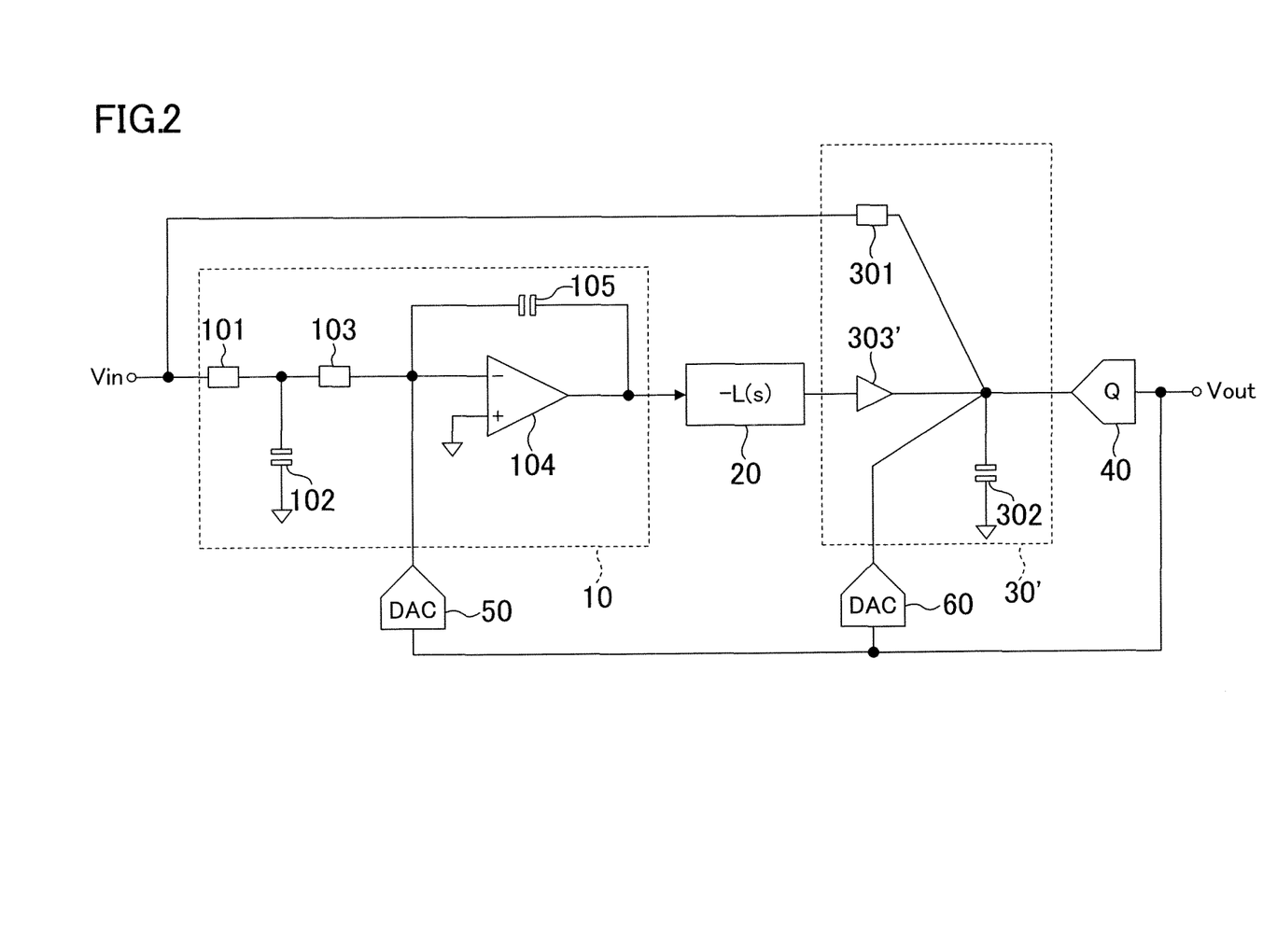
FIG. 2 is a configuration diagram of an oversampling A/D converter according to a second embodiment.

FIG. 2 illustrates a configuration of a CTDS-ADC according to a second embodiment. In the CTDS-ADC according to this embodiment, the filter 30 of the CTDS-ADC in FIG. 1 is replaced with a filter 30'. Features different from those of the first embodiment will be described below.

In the filter 30', the resistive element 303 in the filter 30 is replaced with a voltage-current conversion element 303'. The voltage-current conversion element 303' is coupled to the output terminal of the filter 20 at an input terminal, and coupled to the first end of the capacitive element 302 at an output terminal.

Where a gm value of the voltage-current conversion element 303' is 1/R, the following nodal equation can be obtained.

$$\begin{cases} \dfrac{V_1 - V_{in}}{(n+\alpha-\beta)R} + V_1 \cdot s\left[\dfrac{C}{((n+\alpha)\beta-\beta^2)}\right] + \dfrac{V_1}{\beta R} = 0 \\ -\dfrac{V_1}{\beta R} - V_2 \cdot s \cdot C_1 + \dfrac{V_{out}}{R} = 0 \\ V_3 = -V_2 \cdot L(s) \\ \dfrac{(V_4 - V_{in})}{R} - \dfrac{V_3}{R} + \alpha \cdot \dfrac{V_{out}}{R} + V_4 \cdot s \cdot C = 0 \\ V_{out} = V_4 + Q \end{cases} \quad \text{Equation 2}$$

When n=2 is substituted into the nodal equation to calculate the component of the input signal Vin appearing in the voltage $V_2$, zero is obtained. That is, the input signal Vin is removed at a stage preceding the filter 20. Where the component of the input signal Vin appearing in the digital signal Vout is calculated, $Vout=Vin/(s \cdot C \cdot R+1+\alpha)$ is obtained. That is, a larger gain can be provided than in the CTDS-ADC according to the first embodiment.

Third Embodiment

Figure 3:
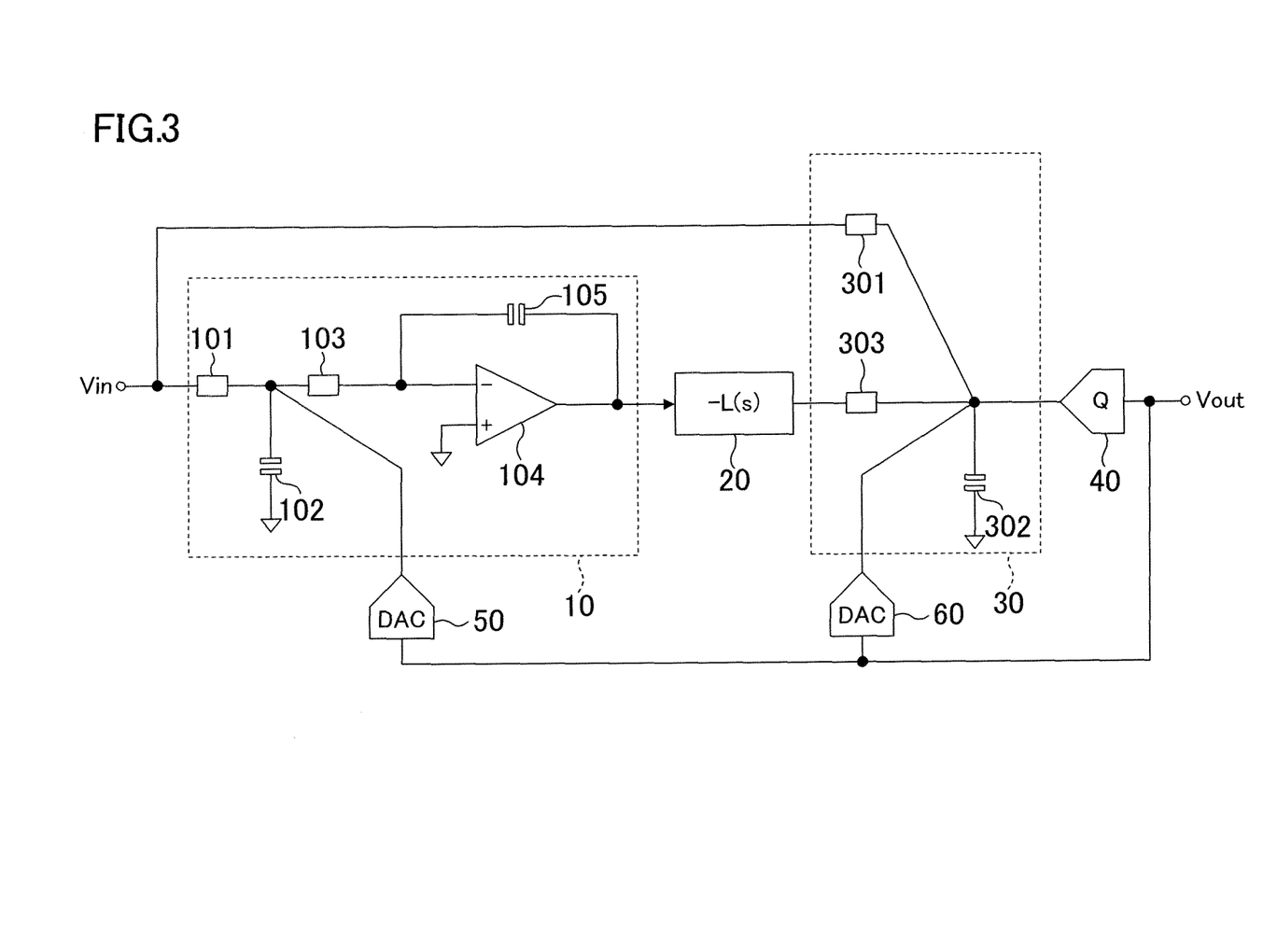
FIG. 3 is a configuration diagram of an oversampling A/D converter according to a third embodiment.

FIG. 3 illustrates a configuration of a CTDS-ADC according to a third embodiment. In the CTDS-ADC according to this embodiment, the output terminal of the D/A converter 50 of the CTDS-ADC in FIG. 1 is not coupled to the inverting input terminal of the operational amplifier 104, but to the first end of the capacitive element 102.

In this embodiment, resistance values of the resistive element 101, the resistive element 103, the resistive element 301, and the resistive element 303 are set to R, and capacitance values of the capacitive element 102 and the capacitive element 302 are set to C, thereby removing the input signal Vin at a stage preceding the filter 20.

Fourth Embodiment

Figure 4:
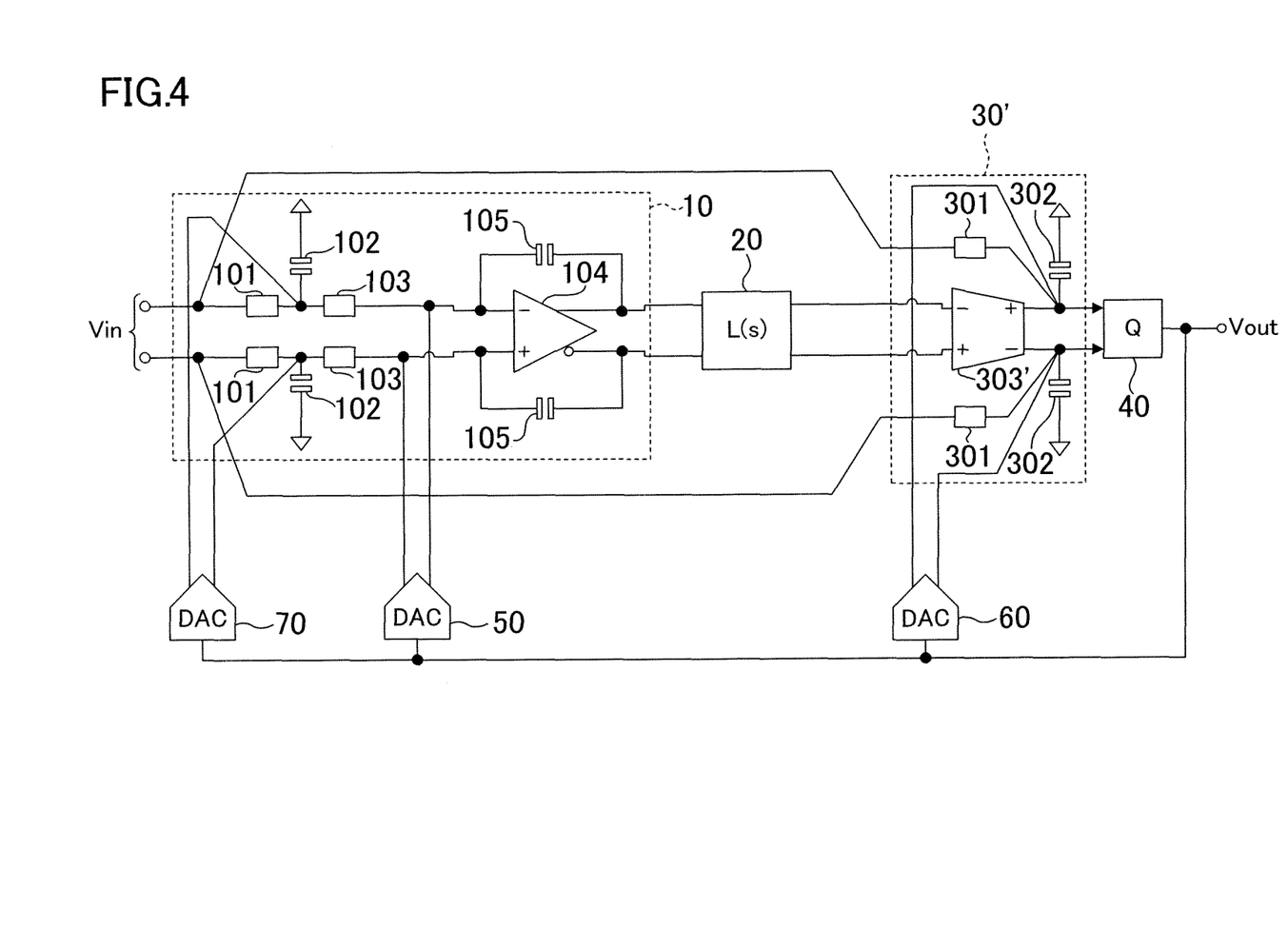
FIG. 4 is a configuration diagram of an oversampling A/D converter according to a fourth embodiment.

FIG. 4 illustrates a configuration of a CTDS-ADC according to a fourth embodiment. In the CTDS-ADC according to this embodiment, the CTDS-ADC of FIG. 2 is of a differential system, and a D/A converter 70 is added, which converts the digital signal Vout to an analog current signal, and inputs the current signal to the first end of the capacitive element 102.

In this embodiment, a gain of the D/A converter 70 is set to $-(\alpha-1)/R$, the transfer function of the filter 20 is $L(s)$, the resistance values of the resistive element 101, the resistive element 103, and the resistive element 301 are set to R, and the capacitance values of the capacitive element 102 and the capacitive element 302 are set to C, thereby removing the input signal Vin at a stage preceding the filter 20.

Fifth Embodiment

Figure 5:
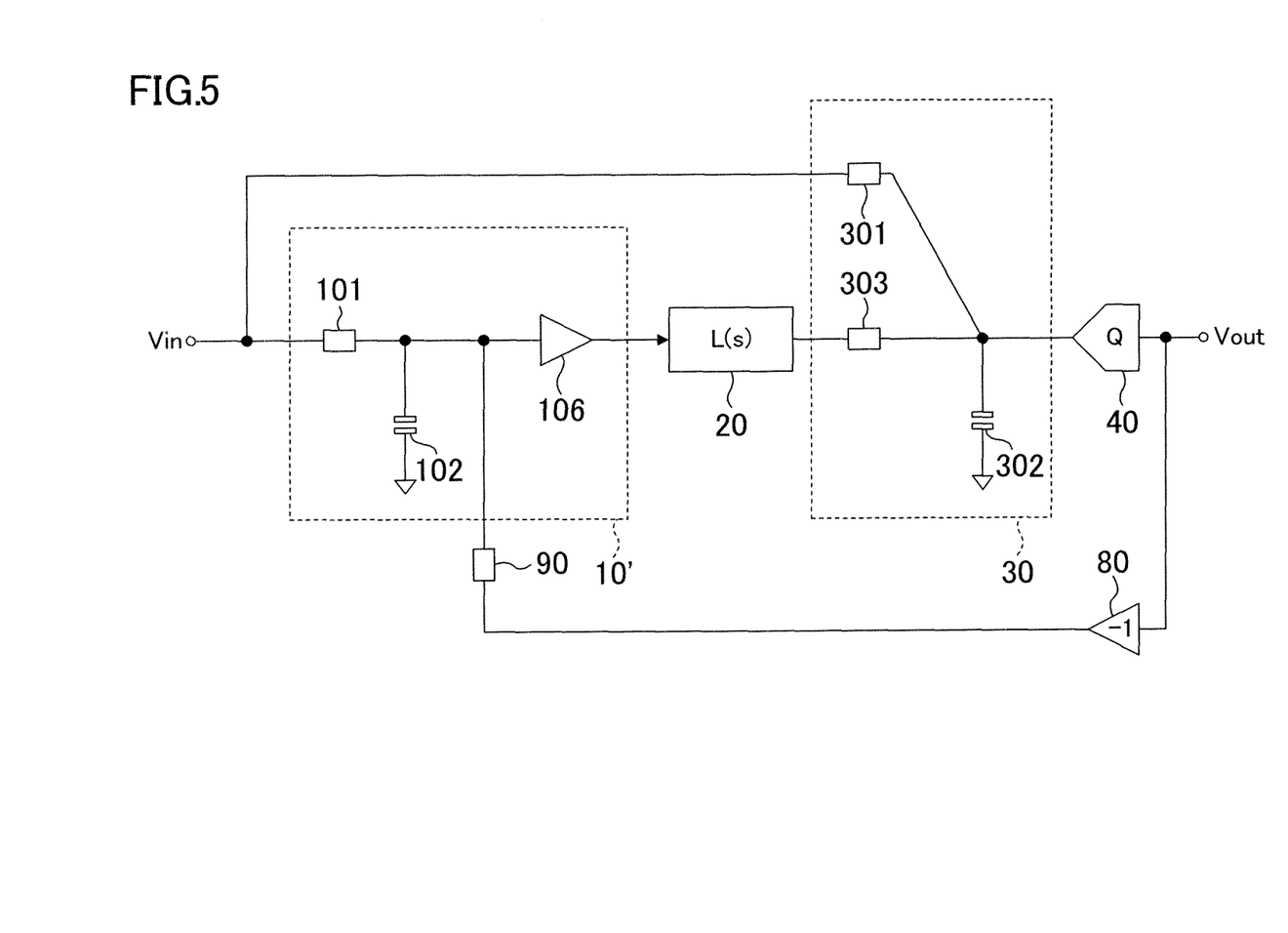
FIG. 5 is a configuration diagram of an oversampling A/D converter according to a fifth embodiment.

FIG. 5 illustrates a configuration of a CTDS-ADC according to a fifth embodiment. In the CTDS-ADC according to this embodiment, a filter 10' includes the resistive element 101 receiving an input signal Vin at a first end, the capacitive element 102 coupled to a second end of the resistive element 101 at a first end, and coupled to the common node at a second end, a voltage-current conversion element 106 coupled to the first end of the capacitive element 102 at an input terminal. The filter 10' outputs an signal from an output terminal of the voltage-current conversion element 106. The filter 20, the filter 30, and the quantizer 40 are as described in the first embodiment. An inverting amplifier 80 inverts and amplifies the digital signal Vout. A resistive element 90 is coupled between an output terminal of the inverting amplifier 80, and the first end of the capacitive element 102.

In this embodiment, resistance values of the resistive element 101, the resistive element 301, the resistive element 303, and the resistive element 90 are set to R, the capacitance values of the capacitive element 102 and the capacitive element 302 are set to C, and a gain of the inverting amplifier 80 is set to −1, thereby removing the input signal Vin at a stage preceding the filter 20.

Sixth Embodiment

Figure 6:
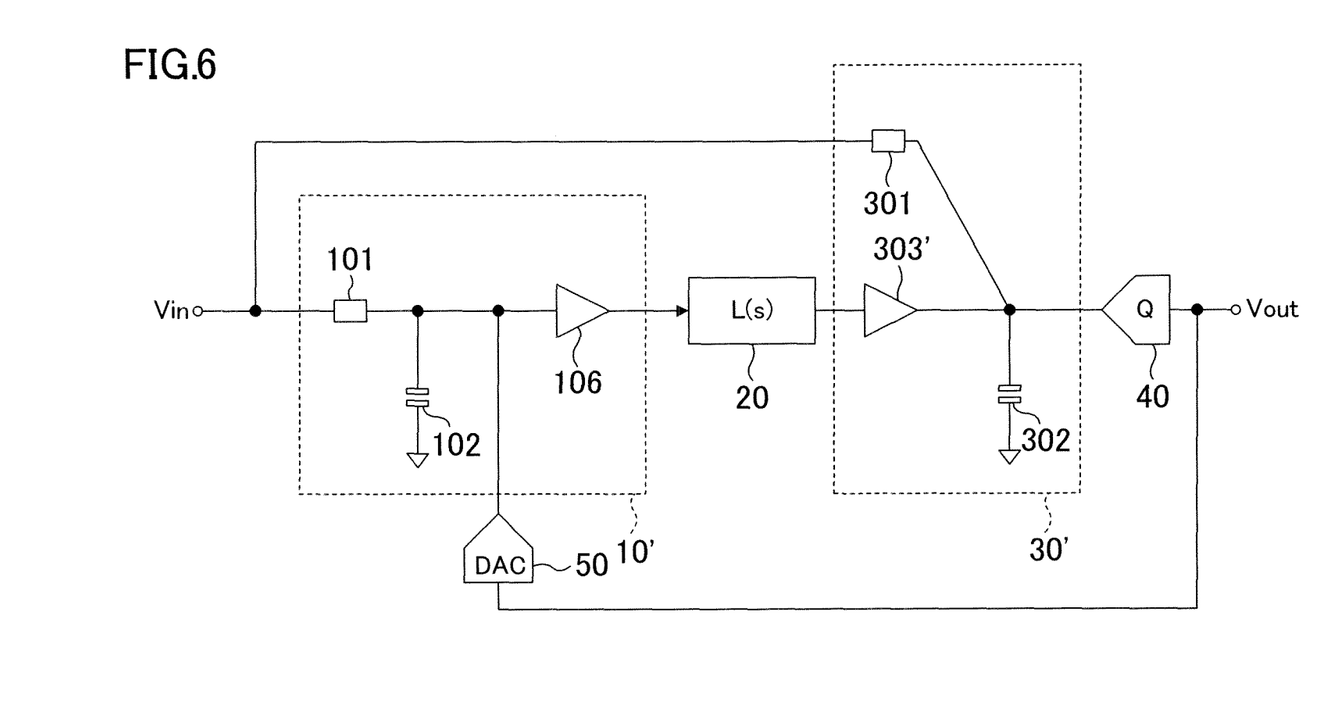
FIG. 6 is a configuration diagram of an oversampling A/D converter according to a sixth embodiment.

FIG. 6 illustrates a configuration of a CTDS-ADC according to a sixth embodiment. In the CTDS-ADC according to this embodiment, the filter 10' is as described in the fifth embodiment. The filter 20, the quantizer 40, and the D/A converter 50 are as described in the first embodiment. The filter 30' is as described in the second embodiment.

In this embodiment, the resistance values of the resistive element 101 and the resistive element 301 are set to R, the capacitance values of the capacitive element 102 and the capacitive element 302 are set to C, the gain of the voltage-current conversion element 303' is set to 1/R, and the gain of the D/A converter 50 is set to −1/R, thereby removing the input signal Vin at a stage preceding the filter 20.

As described above, in the third to sixth embodiments, the resistive elements and the capacitive elements are set to the same element values. This improves robustness against errors in the element values, resulting in an improvement in accuracy of A/D conversion.

What is claimed is:

1. An oversampling A/D converter configured to perform digital conversion of an input signal, the oversampling A/D converter comprising:

a first filter configured to receive the input signal and a first analog signal and to output a first output signal, a continuous-time filter configured to receive the first output signal and to output a second output signal, a second filter configured to receive the input signal and the second output signal and to output a third output signal, a quantizer configured to receive the third output signal and to output a digital signal, and a first D/A converter configured to receive the digital signal and to output the first analog signal, wherein the second filter sums the input signal and the first output signal and has no active element between the input signal and the second output signal.

2. The oversampling A/D converter of claim 1, wherein the first filter comprises an operational amplifier coupled to the first output signal.

3. The oversampling A/D converter of claim 2, wherein the operational amplifier is coupled to the first analog signal.

4. The oversampling A/D converter of claim 1, further comprising:

a second D/A converter configured to receive the digital signal and to output a second analog signal, wherein the second filter receives the second analog signal.

5. The oversampling A/D converter of claim 1, wherein the second filter has only a resistive element between the input signal and the second output signal.

6. The oversampling A/D converter of claim 1, wherein the oversampling A/D converter has a differential system.

7. The oversampling A/D converter of claim 6, wherein the input signal, the first output signal, the second output signal, the third output signal and the first analog signal each comprise differential signals.

\* \* \* \* \*